US006031722A

United States Patent [19]
Paradis et al.

[11] Patent Number: 6,031,722

[45] Date of Patent: Feb. 29, 2000

[54] EARTH COOLED DISTRIBUTION TRANSFORMER SYSTEM AND METHOD

[75] Inventors: Claude Paradis, St. Luc; André Dupont, Boucherville, both of Canada

[73] Assignee: Centre d'innovation sur le transport d'énergie du Québec, Varennes

[21] Appl. No.: 09/119,038

[22] Filed: Jul. 20, 1998

[51] Int. Cl.[7] ........................ H05K 7/20

[52] U.S. Cl. ........................ 361/704; 361/38; 165/104.14; 336/89 C; 337/17; 174/18; 174/16 R

[58] Field of Search .................... 361/704, 38; 174/16.1, 174/16 R, 15 R, 37, 38, 39, 18, 17 LF; 165/45, 104.14; 337/17, 407; 336/84 C, 77; 239/728; 307/17; 52/169.5; 501/130

[56] References Cited

U.S. PATENT DOCUMENTS

| | | | |
|---|---|---|---|
| 1,986,619 | 1/1935 | Blake | 175/298 |
| 2,024,742 | 12/1935 | Parsons | 247/4 |
| 3,212,563 | 10/1965 | Schrader . | |
| 3,377,487 | 4/1968 | McNulti | 307/17 |
| 3,503,025 | 3/1970 | Weinfurt | 336/57 |
| 3,710,002 | 1/1973 | Link | 174/18 |
| 3,728,464 | 4/1973 | Griffing | 174/15 R |
| 3,825,866 | 7/1974 | Piccione | 337/17 |
| 4,009,418 | 2/1977 | Bennett . | |
| 4,137,515 | 1/1979 | Akao et al. | 336/84 C |
| 4,177,078 | 12/1979 | Welna et al. | 106/67 |
| 4,349,801 | 9/1982 | Altmann et al. . | |
| 4,540,967 | 9/1985 | Chitose | 336/84 |
| 4,709,120 | 11/1987 | Pearson | 174/16 R |
| 5,656,984 | 8/1997 | Paradis et al. . | |

FOREIGN PATENT DOCUMENTS

| | | | |
|---|---|---|---|
| 02030105A | 7/1988 | Japan | H01F 27/12 |

*Primary Examiner*—Leo P. Picard
*Assistant Examiner*—Michael Datskovsky
*Attorney, Agent, or Firm*—Swabey Ogilvy Renault; Guy J. Houle

[57] ABSTRACT

An earth cooled distribution transformer system and a method of cooling same and distributing electrical power to a plurality of consumer loads (31) is described. A distribution transformer (10 is provided with the primary (16) and secondary (17) windings encapsulated in a solid insulating material. The steel magnetic core (13) remains exposed and the transformer is buried in ground at a predetermined depth with the core (13) exposed whereby heat generated by the windings is dissipated into the earth through the exposed magnetic core. The high voltage supply cable (20) may be a buried cable or is at least partly buried as well as the power distribution cable (21), which feeds power to one or more consumer loads. The power distribution transformer (10) may be buried adjacent a manhole enclosure (12) with the primary and secondary winding power cables being connected to terminals (22–25) accessible in the manhole. A series of power distribution transformers (10) and supply cables (20) as well as feed cables (12) may be buried in ground in a network to feed an entire residential area without the need to provide insulating casings or even manhole enclosures.

22 Claims, 2 Drawing Sheets

EARTH COOLED DISTRIBUTION TRANSFORMER SYSTEM AND METHOD

TECHNICAL FIELD

The present invention relates to an earth cooled distribution transformer, system and method wherein the transformer is buried directly in the ground with the transformer having its primary and secondary windings casted in a solid insulating material and its steel magnetic core exposed to provide heat dissipation in the surrounding soil, and further wherein the supply cable and feed power cables may also be buried in the ground, and further wherein a plurality of these transformers may form part of a distribution system buried in ground to supply electrical power to an entire consumer load community.

BACKGROUND ART

Distribution transformers are usually mounted in a protection casing which is provided with oil to act as a thermal carrier whereby heat generated by the windings is dissipated through the casing in contact with the oil. The use of oil and casing has proven to be problematic and also increases the physical size of the distribution transformer, making them difficult to directly bury them in the ground. Attempts have been made to bury distribution transformers in the ground as well as their cables which service the homes whereby to eliminate pole-mounted transformers or pad-mounted transformers. However, these buried transformers still required cooling when positioned underground and therefore the transformers were mounted in housings and the oil in the transformer or else the housing was cooled by a system of cooling pipes, also buried in the ground. An example of such distribution transformers construction is disclosed in U.S. Pat. Nos. 3,212,563 and 4,009,418.

With the advent of solid or dry transformers the size of the transformer has been greatly reduced but the cooling of such transformer is usually affected by heat exchange with air or a liquid circulated within the transformer structure or solid heat sinks in contact with ambient air. Some of the difficulties encountered with such solid or dry transformers are that heat dissipation through a solid dielectric material has proven to be poor and the result of thermal build-up can create hot spots or high thermal gradients which can crack the solid dielectric material. This can lead to serious breakdowns which require the replacement of the transformer. Also, most of these transformers require a grounded enclosure to remove any electrical shock hazard. Such enclosures are typically metal cages having dimensions much larger than the transformer itself, thus making installation space requirements difficult.

Recently, and with reference to U.S. Pat. No. 5,656,984, improved solid insulating transformers have been developed but these also require the casting of the entire transformer into a surrounding shell or housing. Such are usually mounted in very large manholes whereby to accommodate the cooling equipment which circulates the cooling liquid through the inner coils and core of the transformer to extract heat. Accordingly, such installations are fairly bulky and expensive. Recently, distribution transformers have also been developed wherein the transformer is fully protected by fiberglass and vinylester resin or else the transformer is casted in concrete. Such transformers are usually mounted in manholes and require some form of cooling medium.

U.S. Pat. No. 4,349,801 describes a single-phase transformer wherein the windings are cast in resin and wherein the wound cores are also protected from corrosion and mechanical damage in a suitable encapsulation of shockproof construction whereby to permit the sealed transformer to be buried in the soil. Waterproof connector sockets are provided to connect underground cable thereto. FIG. 3 of the patent illustrates such a buried-type construction. These transformers are costly to fabricate, are bulky and develop the problems associated with overheating.

SUMMARY OF THE INVENTION

It is a feature of the present invention to provide a power distribution transformer structure which can be buried directly in ground without the use of a cooling agent, whereby the surrounding earth provides the cooling medium to dissipate heat generated by the transformer windings.

Another feature of the present invention is to provide an earth cooled distribution transformer wherein the primary and secondary windings are casted in a solid insulating material with the steel magnetic core remaining relatively exposed and providing for the conduction of heat generated by the windings to dissipate the heat in the surrounding earth.

Another feature of the present invention is to provide an earth cooled distribution transformer which is buried in ground and wherein the high voltage supply cable as well as the power distribution cable of the secondary winding are also buried in ground to form an underground power distribution network to feed electrical power to a plurality of consumer loads.

Another feature of the present invention is to provide an earth cooled distribution transformer which is buried in ground adjacent a manhole enclosure and wherein the connections to the transformer are provided through terminals mounted in the manhole and connected directly into the buried transformer adjacent to the manhole.

Another feature of the present invention is to provide a method of cooling a distribution transformer by burying the transformer in ground with the primary and secondary windings of the transformer being encapsulated in a solid insulating material and the core being exposed to the surrounding earth to provide heat dissipation into the earth.

Another feature of the present invention is to provide a method of distributing electrical power to a plurality of consumer loads through distribution transformers which are buried directly into the ground and wherein the primary and secondary windings of the transformers are insulated in a solid insulating material with their cores being exposed to provide heat dissipation within the surrounding earth.

According to the above features, from a broad aspect, the present invention provides an earth cooled distribution transformer system which comprises a distribution transformer having a steel magnetic core defining core legs about which primary and secondary windings are respectively wound. Each of the windings is insulated by a solid insulating material. The distribution transformer is buried at a predetermined depth in ground with the steel core exposed to the ground whereby to dissipate heat generated by the windings in the ground to cool the transformer by the surrounding earth. A high voltage supply cable is connected to the primary winding and extends at least partly in the ground. A power distribution cable is connected to the secondary winding and extends at least partly in the ground to feed power to one or more consumer loads.

According to a further broad aspect of the present invention there is provided a directly buried distribution transformer having encapsulated windings, feed and distribution electrically insulated cables, and an exposed core. The transformer is buried in soil at a desired depth with the core in contact with the soil whereby to dissipate heat in the soil which acts as a cooling medium.

According to a still further broad aspect of the present invention there is provided a method of cooling a distribution transformer and which method comprises providing a distribution transformer having a steel magnetic core defining core legs about which primary and secondary windings are respectively wound. The windings are insulated in a solid insulating material and the steel core remains exposed. A supply cable is attached to the primary winding. One or more power distribution cables are attached to the secondary winding. The distribution transformer is buried at a predetermined depth in ground with the steel magnetic core exposed to earth whereby to dissipate heat generated by said windings in said ground to cool said transformer by cool surrounding earth. At least part of the supply cable and distribution cables are also buried in the ground.

According to a still further broad aspect of the present invention, there is provided a method of cooling a directly buried distribution transformer comprising the steps of providing a distribution transformer with encapsulated windings, feed and distribution electrically insulated cables and an exposed core. The transformer is directly buried in soil at a desired depth with the core in contact with the soil whereby to dissipate heat in the soil which acts as a cooling medium.

According to a still further broad aspect of the present invention there is provided a method of distributing electrical power to a plurality of consumer loads. The method utilizes the above-mentioned distribution transformer buried in ground and the distribution cable of the secondary winding feeds a plurality of consumer loads. A plurality of distribution transformers may also be interconnected in an underground network of directly buried transformers to supply an entire community of consumer loads.

BRIEF DESCRIPTION OF DRAWINGS

The preferred embodiments of the present invention will now be described with reference to the accompanying drawings in which.

DESCRIPTION OF PREFERRED EMBODIMENTS

Figure 1:
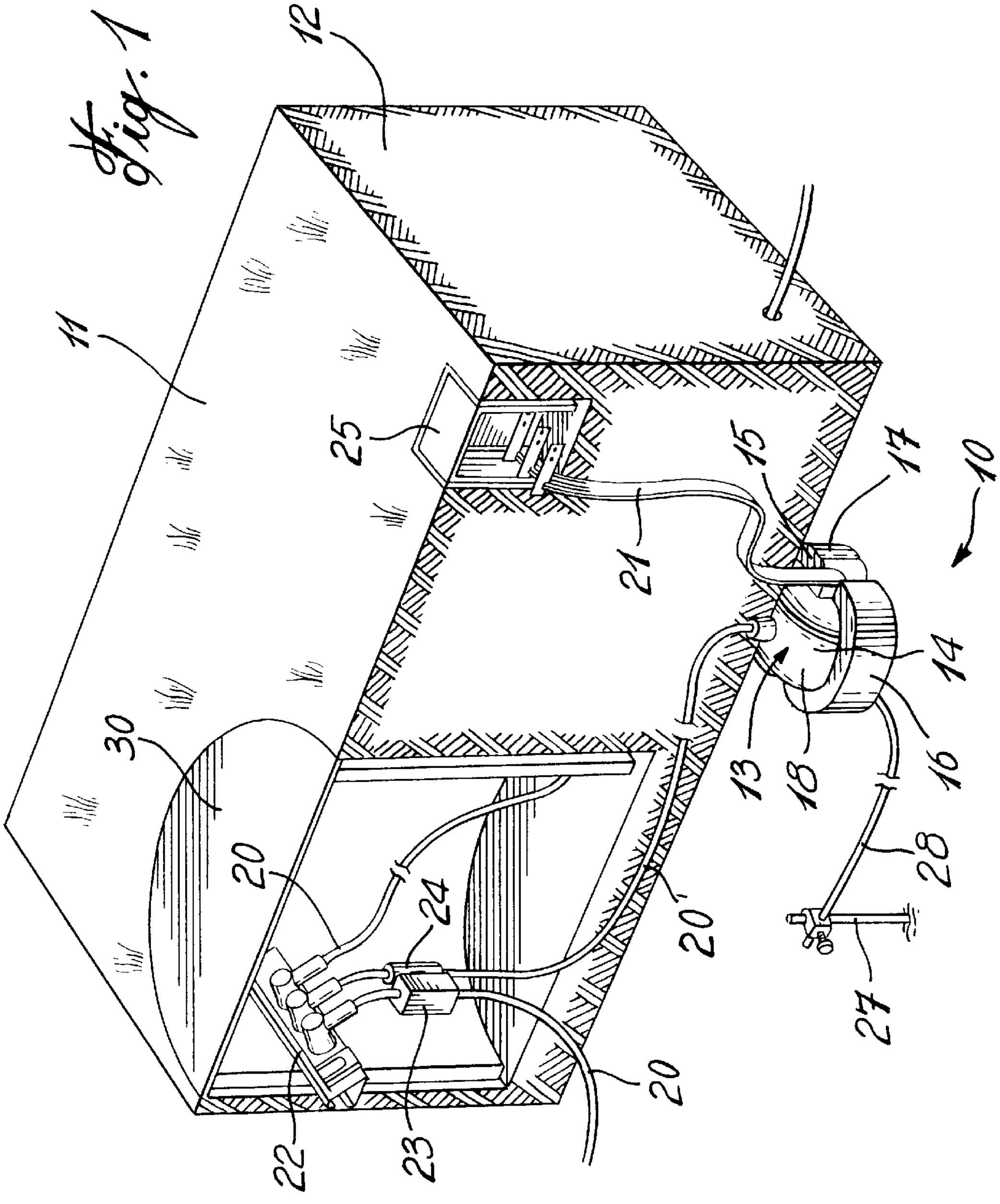
FIG. 1 is a perspective view showing an installation of the earth cooled distribution transformer of the present invention directly buried in the ground adjacent a manhole enclosure.
Figure 2:
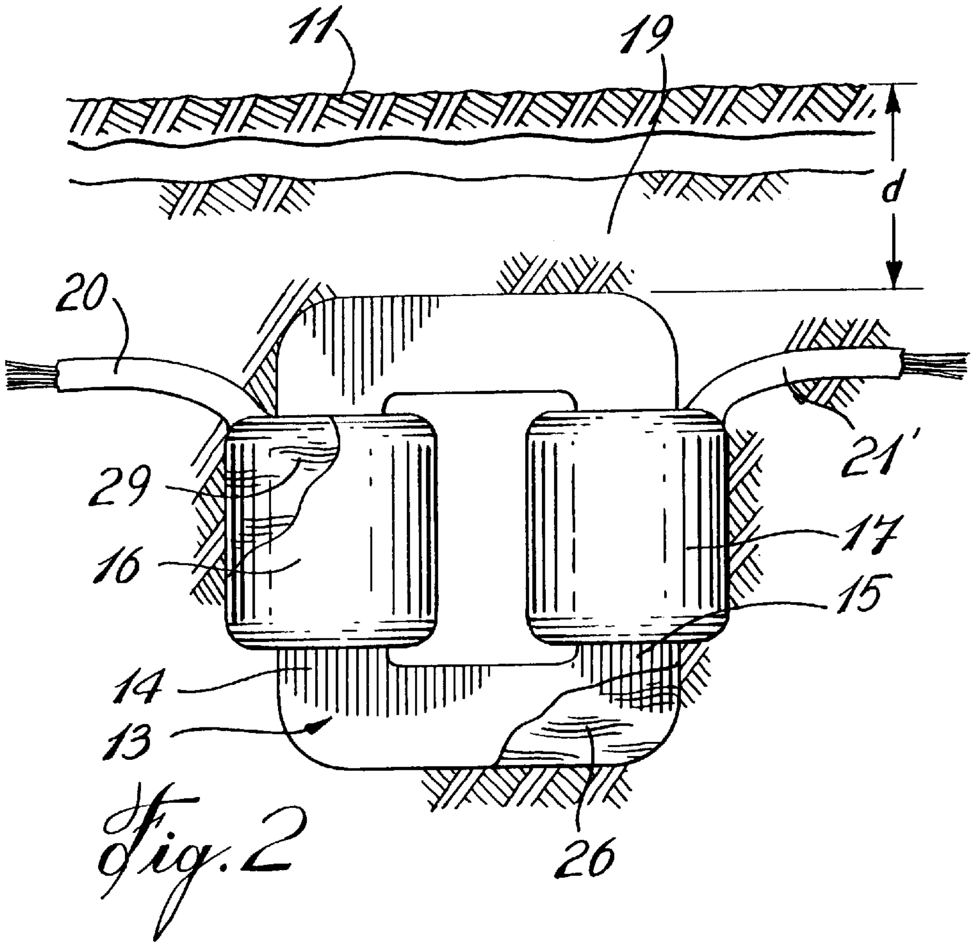
FIG. 2 is a schematic illustration of the power distribution transformer buried in ground to dissipate heat in the surrounding cool earth.

Referring now to the drawings and more particularly to FIG. 1, there is shown generally at 10 the earth cooled distribution transformer of the present invention which is directly buried in the ground 11 and as hereinshown adjacent a manhole enclosure 12. As also shown in FIG. 2, the distribution transformer 10 has a steel magnetic core 13 which defines core legs 14 and 15 about which a primary winding 16 and a secondary winding 17 are wound. Each of the windings 16 and 17 are insulated by a solid insulating resin material 18 as well known in the art. The steel magnetic core 13 remains exposed.

As shown in FIG. 2, the power distribution transformer 10 is buried in the ground 11 at a predetermined depth “d” at which the surrounding ground temperature is at approximately 8° C. which is ideal for cooling the transformer. Because the steel core 13 is exposed to the surrounding earth 19 heat generated by the coils 16 and 17 is transmitted through the core 13 and dissipated into the ground 19. Accordingly, the surrounding ground provides the cooling medium for the transformer and the core acts as a heat sink.

A high voltage supply cable 20 is connected to the primary winding 16 and a power distribution cable is connected to the secondary winding 17. Both these cables extend at least partly in the ground 11. The power distribution cable may be connected to an underground or aboveground terminal whereby to supply power to a plurality of consumer loads usually four or six residential homes.

As hereinshown, the high voltage supply cable, which usually carries approximately 25 KV is connected directly to the primary winding as well as the distribution cable 21. Accordingly, there is no need to provide bushings on the transformer thus resulting in a cost saving. Also, because the transformer is directly exposed to the surrounding earth, there is no need to provide a casing nor an insulating medium. This results in a substantial cost saving in the construction of such power distribution transformers and the size is reduced as there is no housing nor cooling devices.

As shown in FIG. 1, when the power distribution transformer 10 is buried adjacent a manhole enclosure, such as the enclosure 12 illustrated herein, the high voltage supply cable 20 is fed directly into the manhole and connected to the high voltage terminal 22 through a fault detector device 23. A primary supply cable 20' interconnects the primary winding 16 to the terminal 22 and a current limiting fuse 24 is preferably connected to this cable. Another section of the high voltage cable 20 is also connected to the terminal 22 and out of the manhole whereby to supply a further manhole or to connect directly to another distribution transformer, depending on the installation.

As shown in FIG. 1, the manhole is also provided with a junction box 25 where the 120/240 volt supply to the consumer loads is provided. The junction box supplies power to a plurality of consumer loads, as illustrated in FIG. 3.

Referring again to FIG. 2, it is pointed out that the steel magnetic core 13 may be provided with a thermally-conductive coating 26 so as to retard oxidation of the core when exposed to earth. Also, as shown in FIG. 1, a grounding rod 27 may be secured in the ground adjacent the buried transformer 10 and the steel magnetic core may be connected to this grounding rod by a suitable conductor 28, as hereinshown. Additionally, as shown in FIG. 2, the primary and secondary windings may both be provided with a conductive paint such as a carbon paint 29 on the outer insulated surface thereof to provide better thermal conductivity into the surrounding earth. A manhole cover 30 provides access to the interior of the manhole enclosure for installation and servicing.

Figure 3:
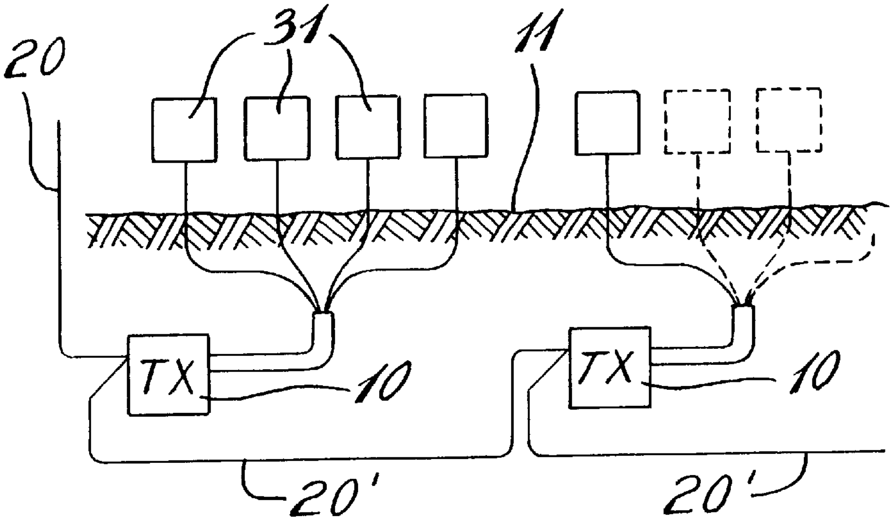
FIG. 3 is a schematic illustration showing a distribution network consisting of a plurality of directly buried distribution transformers feeding a plurality of consumer loads.

With reference to FIG. 3, it can be seen that the earth cooled distribution transformer system of the present invention has many advantages. As shown in FIG. 3, a complete underground direct buried power distribution system may be provided whereby to feed an entire community of consumer loads. As hereinshown, a plurality of transformers 10 are buried under the ground 11 and each feeds a plurality of consumer loads 31. The primary and secondary windings of the transformer may be provided with suitable terminals to provide interconnection of the transformers as well as the consumer loads directly to the transformers. Alternatively, underground or above-ground junction boxes may be provided in suitable safety enclosures. However, when the distribution system is entirely underground, the ground also provides electrical insulation of the distribution system and safety to the people above ground. To locate the power distribution transformers a suitable indicating means would be secured into the ground surface directly above the transformer. The life expectancy of such directly buried transformers and cables is expected to be at least 40 years which is quite suitable as very little or no maintenance will be necessary for such installations as there are no underground bushings or cooling mediums or powered equipment necessary to circulate a cooling medium into the transformers. Thus, the transformer is self-sustaining with the cooling being effected by the natural condition of the surrounding earth. In the event of explosion the earth will absorb the shock and prevent debris projectiles. The transformer will also not contaminate the earth.

The present invention can be summarized as providing a method of cooling a distribution transformer which comprises the provision of the transformer 10 with its steel magnetic core 13 being exposed to surrounding earth when buried in ground and with its windings 16 and 17 being encapsulated in solid insulating material. A supply cable and a power distribution cable is secured to the primary and secondary windings respectively and also laid entirely or partly underground. The transformer is buried at a predetermined depth where it is known that the temperature surrounding the transformer will be sufficient to cool the transformer and this temperature has been found to be adequate when at approximately 8° C. The depth that the transformer is buried varies from location to location depending on the composition of the earth in the ground and other factors such as geographical locations. The transformers may also be buried adjacent manhole enclosures as shown in FIG. 1 although this is not necessary. It is also conceivable that a single manhole enclosure may be associated with one or more buried power distribution transformers 10 of the present invention.

Those skilled in the art will appreciate that the conception, upon which this disclosure is based, may readily be utilized as a basis for the designing of other underground distribution networks while using the same method and system as hereinabove described. It is important, therefore, that the claims be regarded as including such equivalent construction insofar as they do not depart from the spirit and scope of the present invention.

We claim:

1. An earth cooled distribution transformer system comprising a distribution transformer having a steel magnetic core defining core legs about which primary and secondary windings are respectively wound, each said winding being insulated by a solid insulating material, said distribution transformer being buried at a predetermined depth in ground with said steel core exposed to said ground whereby to dissipate heat in said ground generated by said windings, a high voltage supply cable connected to said primary winding and extending at least partly in said ground and a power distribution cable connected to said secondary winding and extending at least partly in said ground to feed power to one or more consumer loads.

2. An earth cooled distribution transformer system as claimed in claim 1 wherein said high voltage supply cable and said distribution cable are directly connected to said primary and secondary windings, respectively.

3. An earth cooled distribution transformer system as claimed in claim 1 wherein said transformer is buried adjacent a manhole enclosure, said manhole enclosure having a high voltage terminal to which said high voltage cable is connected, and a primary supply cable interconnecting said primary winding to said high voltage terminal.

4. An earth cooled distribution transformer system as claimed in claim 3 wherein a high voltage feed cable is connected to said terminal and to another buried power distribution transformer either directly or through a further high voltage distribution terminal of another manhole enclosure associated with said another buried power distribution transformer.

5. An earth cooled distribution transformer system as claimed in claim 3 wherein said manhole enclosure is provided with a junction box to which said one or more power distribution cables are connected.

6. An earth cooled distribution transformer system as claimed in claim 1 wherein said distribution transformer is buried at a depth wherein the ground temperature is in the vicinity of 8° C.

7. An earth cooled distribution transformer system as claimed in claim 1 wherein said steel magnetic core is provided with a thermally conductive coating so as to retard oxidation of said core when exposed to earth.

8. An earth cooled distribution transformer system as claimed in claim 1 wherein a grounding rod is secured in the ground adjacent said buried transformer, said steel magnetic core being connected to said grounding rod.

9. An earth cooled distribution transformer system as claimed in claim 1 wherein said insulating material has a conductive paint on an outer surface thereof.

10. An earth cooled distribution transformer system as claimed in claim 9 wherein said conductive paint is a carbon paint.

11. An earth cooled distribution transformer system as claimed in claim 1 wherein said high voltage supply cable is a 25 KV cable, said distribution cable being a 120/240 volt cable.

12. A directly buried distribution transformer having encapsulated windings, feed and distribution electrically insulated cables and an exposed core;

said transformer being buried in soil at a desired depth with said core in contact with said soil whereby to dissipate heat in said soil which acts as a cooling medium.

13. A method of cooling a distribution transformer comprising the steps of i) providing a distribution transformer having a steel magnetic core defining core legs about which primary and secondary windings are respectively wound, said windings being encapsulated in a solid insulating material and said steel core being exposed, ii) attaching a supply cable to said primary winding, iii) attaching a power distribution cable to said secondary winding, and iv) burying said distribution transformer at a predetermined depth in ground with said steel magnetic core exposed to earth whereby to dissipate heat generated by said windings in said ground to cool said transformer by cool surrounding earth, and at least part of said supply cable and distribution cables also being buried in said ground.

14. A method as claimed in claim 13 wherein said distribution transformer is buried adjacent a manhole enclosure, said step (ii) comprising attaching a primary supply buried cable to a high voltage terminal in said manhole enclosure, said terminal having a high voltage cable connected thereto.

15. A method as claimed in claim 14 wherein said step (iii) comprises connecting said one or more power distribution cables to a junction box of said manhole enclosure.

16. A method as claimed in claim 15 wherein there is further provided the steps of connecting buried feed cables from one or more consumer loads to said junction box.

17. A method as claimed in claim 13 wherein said step (i) further comprises the step of coating said steel magnetic core with a thermally conductive coating so as to retard oxidation of said core when exposed to earth.

18. A method as claimed in claim 13 wherein there is further provided the step of securing a grounding rod in the earth adjacent said transformer and connecting said core to said grounding rod.

19. A method of cooling a directly buried distribution transformer comprising the steps of:

i) providing a distribution transformer with encapsulated windings, feed and distribution electrically insulated cables and an exposed core, and ii) directly burying said transformer in soil at a desired depth with said core in contact with said soil whereby to dissipate heat in said soil which acts as a cooling medium.

20. A method of distributing electrical power to a plurality of consumer loads, said method comprising the steps of:

i) providing a distribution transformer having a steel magnetic core defining core legs about which primary and secondary windings are respectively wound, said windings being encapsulated in a solid insulating material and said steel core being exposed, ii) attaching a supply cable to said primary winding, iii) attaching a power distribution cable to said secondary winding, and iv) burying said distribution transformer at a predetermined depth in ground with said steel magnetic core exposed to earth whereby to dissipate heat generated by said windings in said ground to cool said transformer by cool surrounding earth, and at least part of said supply cable and distribution cable also being buried in said ground, said distribution cable being connected to said consumer loads.

21. An earth cooled distribution transformer system as claimed in claim 20 wherein a plurality of said distribution transformers are buried in said ground at predetermined locations and interconnected by one or more high voltage supply cables also buried in said ground, each said transformer supplying power to a respective group of said plurality of consumer loads by one or more of said power distribution cables also buried in said ground.

22. An earth cooled distribution transformer system as claimed in claim 21 wherein there is further provided one or more manhole enclosures, some of said transformers being buried in ground adjacent one of said manhole enclosures, said supply cable of said primary winding of said transformers being connected to a high voltage terminal in said manhole to which a high voltage supply is connected, said distribution cable being connected to a junction box through which said consumer loads are fed by buried electrically insulated cables.

* * * * *